(12) United States Patent
Lebo et al.

(10) Patent No.: US 6,255,841 B1
(45) Date of Patent: Jul. 3, 2001

(54) STATISTICAL SYSTEM AND METHOD FOR TESTING INTEGRATED CIRCUITS

(75) Inventors: Douglas B. Lebo, Birdsboro; John M. Siket, West Lawn; Michael A. Washko, Barto, all of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/315,248

(22) Filed: May 20, 1999

(51) Int. Cl.[7] ........................................ G01R 31/28
(52) U.S. Cl. ................................ 324/765; 324/158.1
(58) Field of Search ................................ 324/755, 760, 324/765, 73.1, 158.1

(56) References Cited

U.S. PATENT DOCUMENTS

| | | | |
|---|---|---|---|
| 5,144,225 | * | 9/1992 | Talbot et al. .......................... 324/73.1 |
| 5,206,582 | * | 4/1993 | Ekstedt et al. ........................ 324/73.1 |
| 5,798,653 | * | 8/1998 | Leung, Jr. ............................. 324/750 |
| 5,966,527 | * | 10/1999 | Krivokapic ........................ 395/500.35 |

* cited by examiner

*Primary Examiner*—Safet Metjahic
*Assistant Examiner*—T. R. Sundaram

(57) ABSTRACT

A system for, and method of, testing a sample integrated circuit (IC) and a test apparatus incorporating the system or the method. The sample IC includes symmetrical circuits having corresponding intrinsic leakages that depend upon a process employed to manufacture the sample IC. In one embodiment, the system includes: (1) data storage circuitry that contains data derived statistically from exemplary ICs manufactured according to the process and determined to be acceptable and (2) test circuitry, associated with the data storage circuitry, that measures the corresponding intrinsic leakages to determine whether the sample IC is acceptable.

22 Claims, 6 Drawing Sheets

STATISTICAL SYSTEM AND METHOD FOR TESTING INTEGRATED CIRCUITS

TECHNICAL FIELD OF THE INVENTION

The present invention is directed, in general, to integrated circuit (IC) testing and, more specifically, to a system and method for testing integrated circuits that involves statistical analysis.

BACKGROUND OF THE INVENTION

Static-current and circuit-level leakage tests are widely used to detect IC defects. However, these methods typically employ customer-defined or system level leakage limit requirements that are frequently too lenient and therefore incapable of removing devices that significantly stray from the desired population "outliers." Historically, these device outliers have been proven to exhibit relatively poor early life performance. This weakness has been somewhat overcome through the use of statistically-based, production-level leakage limits to remove device outliers from production shipments. However, the quality and cost effectiveness of this method is limited by process-dependent, intrinsic transistor leakage variability.

Historically, many improvements in device deliverable quality and reliability have been attained through the use of statistically-based leakage limits (SBLL) as a means of removing leakage outliers from production shipments. These techniques are based on the theory that intrinsically good circuits exhibit a gaussian-like distribution of leakage current measurements. Conversely, devices containing point defects exhibit abnormally high leakage values relative to the parent population.

SBLL techniques employ descriptive statistics from a normal distribution of leakage current measurements to calculate ±3 sigma test limits that encompass 99.7% of the parent population. Devices that fall outside the SBLL include those that have been degraded by point defects. Aging experiments have consistently shown that this subset of leakage outliers yields significantly higher early life failure rates than the parent population. As a result, circuit designs tested using SBLL methods typically have higher levels of quality and reliability than products screened against customer-defined or system level requirement leakage limits.

Although SBLL techniques can significantly improve quality, the most significant detractor to their widespread use is the potential for high manufacturing costs resulting from excessive yield loss. This problem is most evident when the wafer fabrication process drifts near its allowable operating extremes causing the intrinsic semiconductor and circuit-level leakage characteristics to shift significantly. When this occurs, manufacturing yields become suppressed by a magnitude that is proportional to the shift in the leakage distribution. This yield suppression occurs because the previously defined SBLL become invalid, since the mean and sigma values from which they were derived no longer apply. Issues centered on the cost, quantity, and shipping requirements of said product typically result in burn-in evaluation experiments of the marginal leakage failures. These evaluations typically support the release of affected product to meet immediate customer demand, thereby reducing organizational support of SBLL test methods and ultimately resulting in poorer outgoing quality.

Another less apparent weakness of conventional SBLL methods stems from normal time-based process variations. These variations are reflected in circuit level leakage measurements even though their impact may seem relatively superficial. However, during a process capability study phase in which a cross-section sampling of production lots are evaluated, even minor time-based process variations can act to distort the calculated standard deviation of circuit level leakage from which SBLLs are derived. Excessively wide SBLL may result, which reduce defect-screening effectiveness by allowing some leakage outliers near the tails of the parent population to be shipped to the customer.

Accordingly, what is needed in the art is an effective method of screening leakage outliers from the intrinsic parent population with minimal negative impact on manufacturing costs and customer service.

SUMMARY OF THE INVENTION

To address the above-discussed deficiencies of the prior art, the present invention provides a system for, and method of, testing a sample IC and a test apparatus incorporating the system or the method. The sample IC includes symmetrical circuits having corresponding intrinsic leakages that depend upon a process employed to manufacture the sample IC. In one embodiment, the system includes: (1) data storage circuitry that contains data derived statistically from exemplary ICs manufactured according to the process and determined to be acceptable and (2) test circuitry, associated with the data storage circuitry, that measures the corresponding intrinsic leakages to determine whether the sample IC is acceptable.

The present invention is the first to recognize that, since leakages in ICs are process-dependent, they should not unduly influence quality control. The present invention tempers the influence of leakage variations by statistically deriving data regarding acceptable ICs that have been manufactured according to a given process and applying the statistically derived data to leakages measured in a sample IC to determine whether the sample IC is acceptable. For purposes of the present invention, "symmetrical" is defined as substantially symmetrical, rather than precisely symmetrical. The circuits must be symmetrical enough such that leakages substantially offset one another.

In one embodiment of the present invention, the test circuitry determines whether the corresponding intrinsic leakages fall within an acceptable range with respect to the data. In an embodiment to be illustrated and described, the range is expressed in terms of a number of standard deviations from a given regression line. Of course, the range need not be fixed or be about a regression line. Those skilled in the pertinent art will realize that other statistical methods may be employed to advantage.

In one embodiment of the present invention, the data comprise a regression line and an acceptable range of scatter based on percent cumulative probability dropout. In the embodiment to be illustrated and described, the acceptable range of scatter is ±10 units of measure.

In one embodiment of the present invention, the test circuitry develops a ratio of the corresponding intrinsic leakages. Ratios of multiple ICs manufactured by a given process normally scatter about a given line of regression. In the embodiment to be illustrated and described, this regression line is employed as a center for a given range of acceptable deviation.

In one embodiment of the present invention, the data comprise a regression line about which the scatter in paired measurements for a given device will fall within a box defined by the accuracy of the test set measurement unit employed. In an embodiment to be illustrated and described, the test limits are 2½ times the test set measurement unit accuracy. The accuracy of the test set measurement range may be determined either from the manufacturer's advertised specifications or empirically derived through statistical error-of-measurement studies. In either case, the worst-case scatter in the data-points resulting from repetitive measurements of the same device is defined by the hypotenuse of the box:

2½ * the accuracy of the test-set measurement unit. In the embodiment to be illustrated and described, defining test limits through this method is useful when auto-range measuring techniques are employed such that the measurement accuracy is range-dependent.

In one embodiment of the present invention, the differences between paired measurements will be shown to approximate a gaussian distribution centered about the ordinate or some slightly skewed non-zero number. In the embodiment to be illustrated and described, test limits may be determined through statistical methods.

In one embodiment of the present invention, the symmetrical circuits comprise a tip circuit and a ring circuit. The tip and ring circuits may form part of analog telecommunications circuitry. In an alternative embodiment, the sample IC contains random access memory (RAM) circuitry. Those skilled in the pertinent art will understand, however, that the present invention is employable with any IC having sufficient symmetry.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
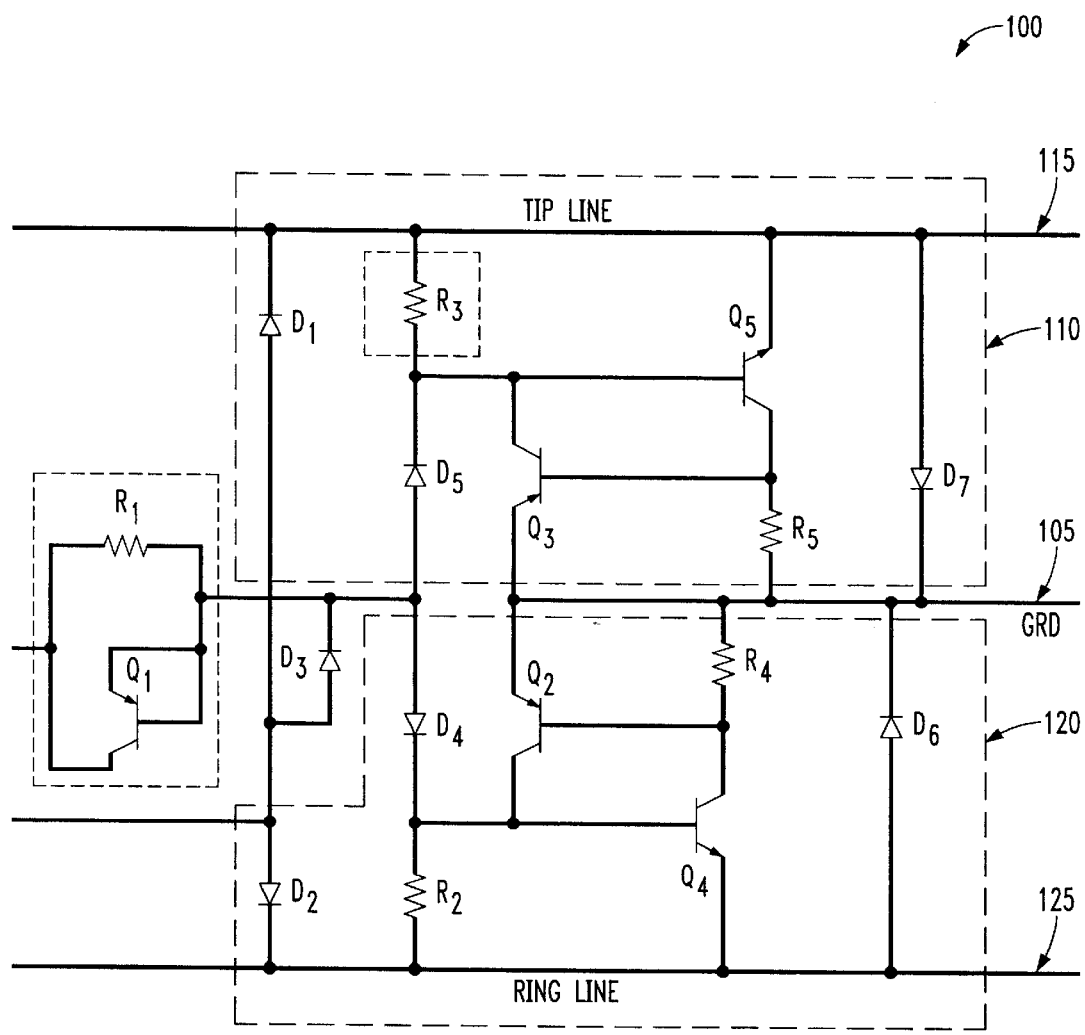
FIG. 1 illustrates a schematic diagram showing an example of a telecommunications circuit that is substantially symmetric in design.

Referring initially to FIG. 1, illustrated is a schematic diagram showing an example of a telecommunications circuit 100 that is substantially symmetric in design. The telecommunications circuit 100 is illustrated as being a sample IC comprising a tip circuit 110 and a ring circuit 120 that demonstrates the property of being symmetrical in design. The tip circuit 110 and the ring circuit 120 form at least a part of an analog telecommunications circuit, as shown. Tip, ring and ground lines 115, 125, 105, respectively, form a conductive path between a central location and an end-user. The tip and ring lines 115, 125 accept a balanced voice or data signal between them, while the ground line 105 may be used occasionally for special signaling functions.

For this embodiment, the symmetry demonstrated by the telecommunications circuit 100 occurs because the tip circuit 110 and the ring circuit 120 are identical circuits arranged symmetrically around the ground line 105. The remaining circuitry of the telecommunications circuit 100 is not symmetrical, but constitutes a small portion of the total circuitry thereby allowing the telecommunications circuit 100 to be substantially symmetrical.

A stated previously, the present invention recognizes that, since leakages in ICs are typically process-dependent, they should not unduly influence quality control. The present invention tempers the influence of variations in leakage by statistically deriving data regarding acceptable ICs that have been manufactured according to a given process. Then, the statistically derived data is applied to leakages measured in a sample IC to determine whether the sample IC is acceptable. Recall that, for purposes of the present invention, symmetrical may be defined as substantially symmetrical, rather than precisely symmetrical, as discussed above. That is, the sample IC circuits must be symmetrical enough such that intrinsic leakages substantially offset one another.

Figure 2:
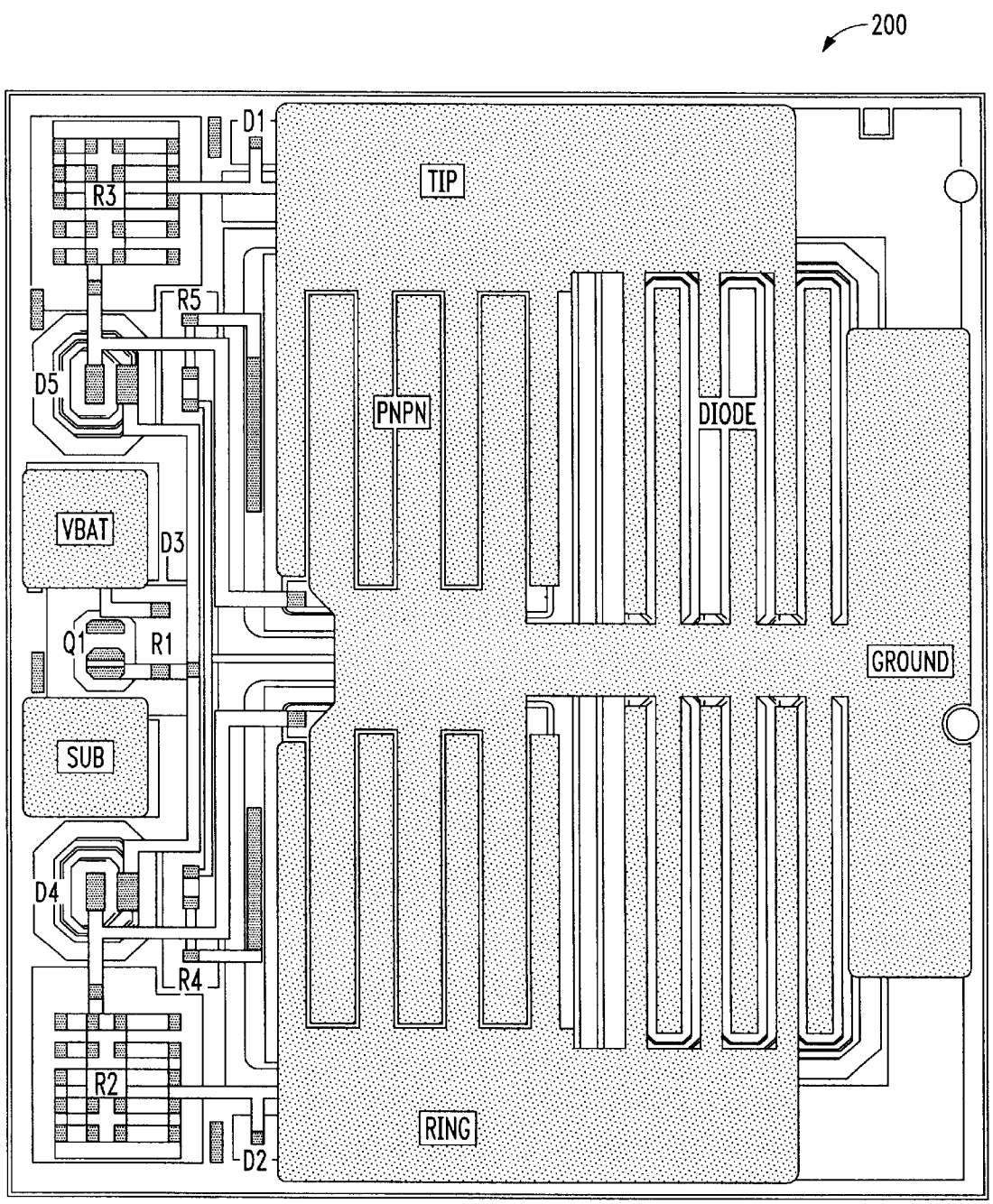
FIG. 2 illustrates an integrated circuit topological layout of the telecommunications circuit of FIG. 1 showing a substantial symmetry in circuit geometry.

Turning now to FIG. 2, illustrated is an integrated circuit topological layout 200 of the telecommunications circuit 100 showing a substantial symmetry in circuit geometry. The IC topological layout 200 illustrates that the telecommunications circuit 100, which is substantially symmetrical in design, is also substantially symmetrical in geometry. This may be observed in the IC topological layout 200, since the top half is essentially the tip circuit 110 and the bottom half is essentially the ring circuit 120.

The situation where symmetry in design dictates symmetry in layout geometry is true for a large number of cases. Since intrinsic IC leakage is generally dependent on the manufacturing process as stated earlier, the quality of an IC being symmetric in geometry allows the effect of intrinsic leakages to be removed for the ideal case. In practical cases, substantially symmetric IC designs exhibit nearly identical leakage characteristics in the absence of defects. Therefore, deviations in electrical measurements from a range of normally occurring intrinsic test values typically indicates that a defect exists for the IC circuit or suite of IC circuits under test.

Figure 3:
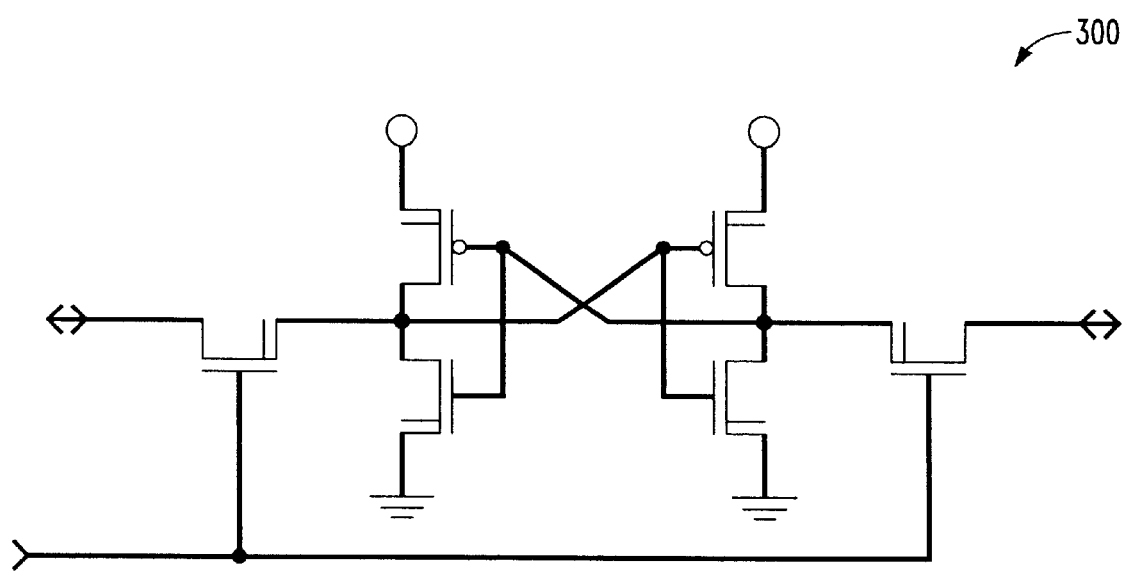
FIG. 3 illustrates a schematic diagram showing an example of a static RAM circuit.

Turning now to FIG. 3, illustrated is a second embodiment in which the sample IC contains static random access memory (SRAM) circuitry 300. SRAM circuitry is symmetrical with respect to complementary positive metal-oxide semiconductor (PMOS) pull-up and negative metal-oxide semiconductor (NMOS) pull-down transistors therein and is therefore another opportunity for applying the present invention. Those skilled in the pertinent art will understand, however, that the present invention is employable with any IC having sufficient circuit symmetry.

Figure 4:
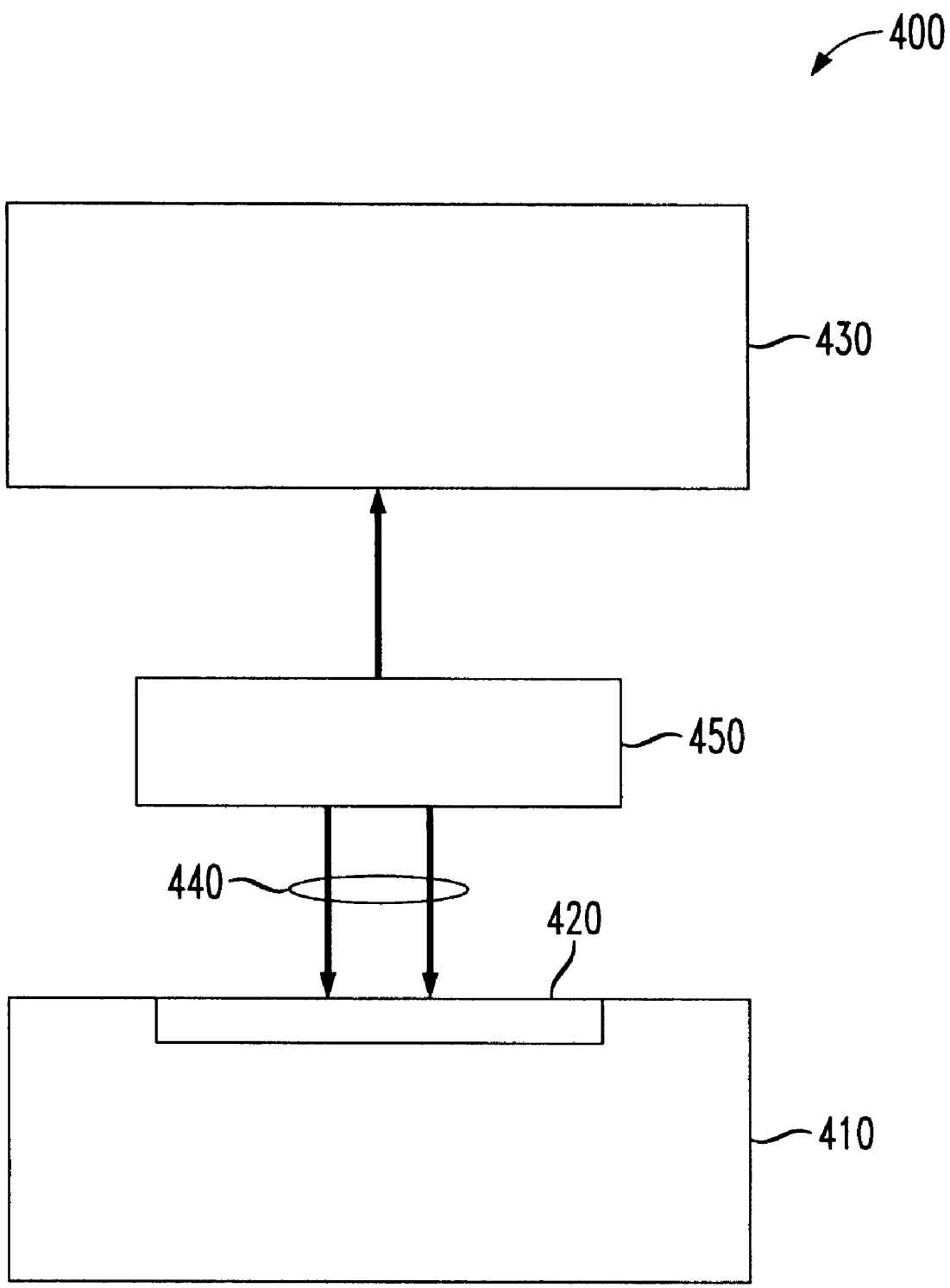
FIG. 4 illustrates a diagram of a system showing a test apparatus for determining integrated circuit leakage data.

Turning now to FIG. 4, illustrated is a diagram of a system showing a test apparatus 400 for determining integrated circuit leakage data. The test apparatus 400 may be used for testing a sample IC that includes symmetrical circuits where the sample IC has corresponding intrinsic leakages that depend upon its manufacturing process. The test apparatus 400 comprises a fixture 410 that holds a sample IC 420, a data storage circuitry 430, two test probes 440 couplable to the sample IC 420 and a test circuitry 450 coupled to the two test probes 440.

The data storage circuitry 430 contains test data derived statistically from exemplary ICs manufactured according to the process and determined to be acceptable. The test circuitry 450 is coupled to the two test probes 440 and is associated with the data storage circuitry 430. The test circuitry 450 measures the corresponding intrinsic leakages to determine whether the sample IC 420 is acceptable.

Figure 6:
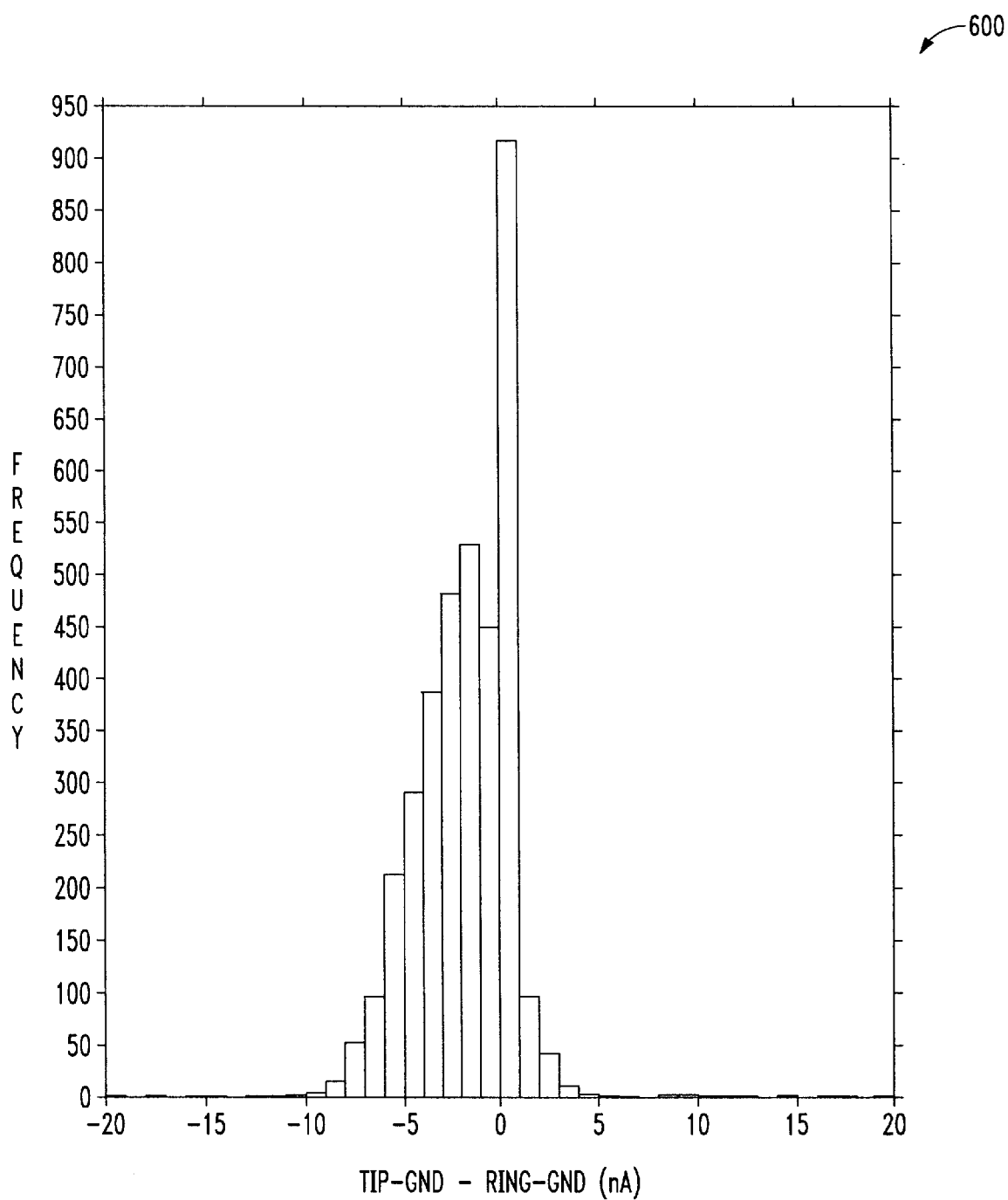
FIG. 6 illustrates a graph showing a leakage data test sample distribution for the population of FIG. 5.

In the current embodiment of the present invention, the test circuitry 450 determines whether the corresponding intrinsic leakages being measured in the sample IC 420 fall within an acceptable range with respect to the data stored in the data storage circuitry 430. The range may be expressed in terms of a number of standard deviations from a given regression line. Of course, the range need not be fixed or be about a regression line. Those skilled in the pertinent art will realize that other statistical methods may be employed to advantage. In the present embodiment, the test circuitry 450 develops a ratio, a difference or both a ratio and a difference of the corresponding paired leakage measurements. Since ratios of multiple ICs manufactured by a given process normally scatter about a given line of regression, this regression line is employed as a center for a given range of acceptable deviation. Likewise, the distribution of differences resulting from paired measurements forms a gaussian-like distribution centered about the ordinate or some slightly skewed non-zero number as illustrated in FIG. 6. This ordinate or statistically determined "mean" value is employed as a center about which an acceptable range of deviation may be determined.

Figure 5:
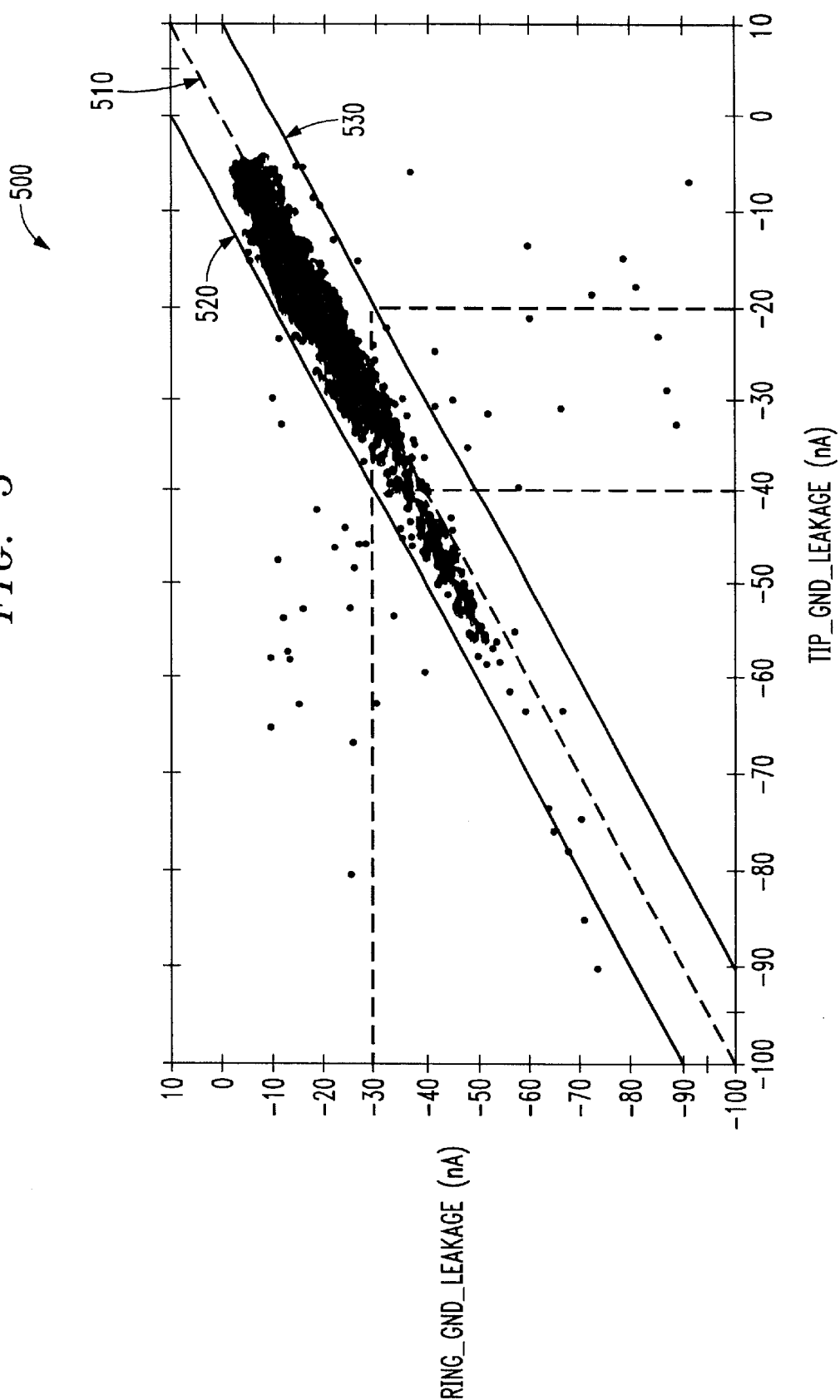
FIG. 5 illustrates a graph showing a test sample leakage data population.

Turning now to FIG. 5, illustrated is a graph showing a test sample leakage data population 500. The test sample leakage data population 500 includes a regression line 510, an upper acceptable test sample deviation line (UATSDL) 520 and a lower acceptable test sample deviation line (LATSDL) 530. Each of the data points shown in the test sample leakage data population 500 is a coordinate coupling a value of ring-to-ground leakage current and tip-to-ground leakage current expressed in nanoamperes.

The regression line 510 is seen to be that locus of points where the ring-to-ground and tip-to-ground leakage currents are equal. The UATSDL 520 and the LATSDL 530 define the acceptable range of leakages for the sample IC under test and data representing a locus of the UATSDL 520 and the LATSDL 530 are stored in the data storage circuitry 430 of FIG. 4. The UATSDL 520 and the LATSDL 530 define an acceptable range of scatter based on percent cumulative probability dropout around the regression line 510. The acceptable range of scatter from the regression line is ±10 nanoamperes in this case. The "outlier" leakage data points that lie outside this acceptable range are devices that have a high probability of having defects and would therefore be rejected.

FIG. 5 highlights some of the advantages of the present invention over conventional SBLL methods. In this case, many outliers identified by the invention would have fallen within the normal distribution of single-measurement leakage values and therefor not been detected by SBLL techniques. FIG. 5 also shows how certain embodiments of the present invention can remove devices with paired leakage measurements falling outside a very stringent 20 nanoampere range, even though the range of individual measurements is nearly five times as large.

Turning now to FIG. 6, illustrated is a graph showing a test sample leakage data distribution 600 for the population of FIG. 5. The test sample leakage data distribution 600 shows categories of the frequencies wherein the tip-to-ground minus the ring-to-ground leakage data points of FIG. 5 occur. The majority of leakage data points of the test sample leakage data population 500 may be seen to reside above the regression line 510 within the acceptable range. This skews the test sample leakage data distribution 600 to the left as shown. Several conditions may cause this skewing.

If the sample IC belongs to a family of circuits where enough asymmetry is present, a skewed distribution such as the test sample leakage data distribution 600 may result. However, for this case, the regression line 510 may also be shifted such that there is a more balanced population within the acceptable range, thereby extending the present invention to more asymmetric geometries. Of course, a limit in asymmetry may be reached at which the results are indeterminate. Test conditions may also contribute to the shape of the test sample leakage data distribution 600. For example, a temperature shift in the sample IC during testing may also skew data points, since leakage currents are sensitive to temperature. Monitoring of the sample IC temperature may allow correction of the data in the data storage circuitry 430. Of course, other current and future causes and corrections may be determined as appropriate.

From the above, it is apparent that the present invention provides a system for, and method of, testing a sample IC and a test apparatus incorporating the system or the method. The sample IC includes symmetrical circuits having corresponding intrinsic leakages that depend upon a process employed to manufacture the sample IC. In one embodiment, the system includes data storage circuitry that contains data derived statistically from exemplary ICs manufactured according to the process and determined to be acceptable. The system further includes test circuitry, associated with the data storage circuitry, that measures the corresponding intrinsic leakages to determine whether the sample IC is acceptable.

Although the present invention has been described in detail, those skilled in the art should understand that they can make various changes, substitutions and alterations herein without departing from the spirit and scope of the invention in its broadest form.

What is claimed is:

1. A system for testing a sample integrated circuit (IC), comprising:
    data storage circuitry that contains data defining an acceptable range of offsetting intrinsic leakage currents of symmetrical circuits derived statistically from acceptable exemplary ICs having the symmetrical circuits therein manufactured according to a process employed to manufacture a sample IC that includes the symmetrical circuits; and
    test circuitry for testing said sample IC, associated with said data storage circuitry, configured to measure leakage currents and compare a value of said leakage currents with said data to determine whether said sample IC is acceptable.

2. The system as recited in claim 1 wherein said test circuitry determines whether said corresponding intrinsic leakages fall within an acceptable range with respect to said data.

3. The system as recited in claim 1 wherein said data comprise a regression line and an acceptable range of scatter based on percent cumulative probability dropout.

4. The system as recited in claim 1 wherein said test circuitry develops at least a selected one of a ratio and a difference of said corresponding leakage measurements.

5. The system as recited in claim 1 wherein said symmetrical circuits comprise a tip circuit and a ring circuit.

6. The system as recited in claim 1 wherein said sample IC contains random access memory (RAM) circuitry.

7. The system as recited in claim 1 wherein said sample IC contains analog telecommunications circuitry.

8. A method of testing a sample integrated circuit (IC), comprising:

statistically deriving data defining an acceptable range of offsetting intrinsic leakage currents of symmetrical circuits from exemplary ICs having the symmetrical circuits therein manufactured according to a process employed to manufacture a sample IC that includes the symmetrical circuits; and measuring leakage currents of said sample IC and comparing a value of said leakage currents with said data to determine whether said sample IC is acceptable.

9. The method as recited in claim 8 wherein said measuring comprises determining whether said corresponding intrinsic leakages fall within an acceptable range with respect to said data.

10. The method as recited in claim 8 wherein said statistically deriving comprises:

statistically deriving a regression line; and determining an acceptable range of scatter based on percent cumulative probability dropout.

11. The method as recited in claim 8 wherein said measuring comprises developing at least a selected one of a ratio and a difference of said corresponding leakage measurements.

12. The method as recited in claim 8 wherein said test limits are based on a multiple of a test set measurement unit accuracy.

13. The method as recited in claim 8 wherein said symmetrical circuits comprise a tip circuit and a ring circuit.

14. The method as recited in claim 8 wherein said sample IC contains random access memory (RAM) circuitry.

15. The method as recited in claim 8 wherein said sample IC contains analog telecommunications circuitry.

16. Test apparatus for testing a sample integrated circuit (IC), comprising:

a fixture that holds a sample IC having symmetrical circuits;

data storage circuitry that contains data defining an acceptable range of offsetting intrinsic leakage currents of the symmetrical circuits derived statistically from acceptable exemplary ICs having the symmetrical circuits therein manufactured according to a process and determined employed to manufacture said sample IC;

at least two test probes couplable to said sample IC; and test circuitry for testing said sample IC, coupled to said at least two test probes and associated with said data storage circuitry, configured to measure leakage currents and compare a value of said leakage currents with said data to determine whether said sample IC is acceptable.

17. The test apparatus as recited in claim 16 wherein said test circuitry determines whether said corresponding intrinsic leakages fall within an acceptable range with respect to said data.

18. The test apparatus as recited in claim 16 wherein said data comprise a regression line and an acceptable range of scatter based on percent cumulative probability dropout.

19. The test apparatus as recited in claim 16 wherein said test circuitry develops at least a selected one of a ratio and a difference of said corresponding leakage measurements.

20. The test apparatus as recited in claim 16 wherein said symmetrical circuits comprise a tip circuit and a ring circuit.

21. The test apparatus as recited in claim 16 wherein said sample IC contains random access memory (RAM) circuitry.

22. The test apparatus as recited in claim 16 wherein said sample IC contains analog telecommunications circuitry.

* * * * *